Jan. 11, 1966 D. STRAW ET AL 3,228,768

PROCESS OF DIFFUSION PRINTING AND A STRUCTURE FOR USE THEREIN

Filed Dec. 13, 1960 2 Sheets-Sheet 1

*INVENTORS*
DOUGLAS STRAW
CLIFFORD E. HERRICK, JR
*BY* Henry L. Coughlin
Edward P. Gilhooly
ATTORNEY

INVENTOR.
DOUGLAS STRAW
CLIFFORD E. HERRICK, JR
BY
ATTORNEY

United States Patent Office 3,228,768

Patented Jan. 11, 1966

3,228,768
PROCESS OF DIFFUSION PRINTING AND A STRUCTURE FOR USE THEREIN

Douglas Straw, Binghamton, N.Y., and Clifford E. Herrick, Jr., Concord, Mass., assignors to General Aniline & Film Corporation, New York, N.Y., a corporation of Delaware Filed Dec. 13, 1960, Ser. No. 75,566
15 Claims. (Cl. 96—49)

This invention relates to a novel process of diffusion printing whereby an intermediate master is produced which can be used in the diazotype reproduction process and to a novel plate suitable for use in such process.

A process for obtaining reflex copies which are suitable as offset printing masters utilizing diazotype materials which yield positive copies from positive originals has been proposed in application Serial No. 770,052 filed October 28, 1958, now abandoned. The image resulting from such process can, if desired, be made visible and opaque to ultraviolet light by inking in order to render the master useful as an intermediate for producing subsequent diazotype copies. The process disclosed in the above-identified application has many desirable qualities such as extremely high contrast of the photomechanical system, relatively short exposure times and suitability of the light-sensitive layer for reflex copying. However, the inking step was found to be messy and time consuming.

It is an object of this invention to provide a new process of diffusion printing retaining the desirable qualities of the process disclosed in the aforementioned application Serial No. 770,052, but omitting the inking step to produce an intermediate master having colored and opaque images.

A further object of this invention is to provide a novel process for diffusion printing utilizing a diazo oxide as the light-sensitive material.

A still further object of this invention is to provide a light-sensitive structure comprising a carrier layer which is permeable to mildly alkaline solutions and which has incorporated therein at least one component capable of reacting with another component to develop a color or to form a dye.

Other objects and advantages of this invention will become apparent to those skilled in the art from the detailed description of our invention given below.

The light-sensitive structure we use in our novel process comprises a base, a carrier layer on the base which is permeable to mildly alkaline solutions and which contains at least one component of a color-forming reaction, and a light-sensitive or photomechanical layer coated on said carrier layer. This light-sensitive structure is exposed to actinic light together with an original, thereby causing the irradiated areas of the light-sensitive layer to become more permeable than the unirradiated areas toward certain mildly alkaline solutions. The exposed structure is then developed with a developing solution which contains one or more components of a color-forming reaction which will react with the color-forming component in the carrier layer to develop a color or dye therein. The developing solution diffuses or permeates the more permeable areas of the photomechanical layer and reacts with or causes a reaction of the color component or components in the carrier layer in the areas immediately below the more permeable or light-struck areas of the light-sensitive layer, thereby forming an image which is predominantly in the carrier layer. The developed structure can now be used as such or as an intermediate master for making diazotype copies. If desired, however, the residual photomechanical layer can be removed with a selected solvent of solvent system which is a solvent for the photomechanical layer but does not materially leach or bleed the dye or color formed in the carrier layer; and the base with the carrier layer having the image formed therein, but devoid of the photomechanical layer, can be used as an intermediate master.

As a base for our novel light-sensitive structure, we can use any transparent or translucent material such as cellulose esters, cellulose ethers, regenerated cellulose, vinyl polymers such as polystyrene and the like. Examples of the cellulose esters we may use are cellulose acetate, cellulose propionate and cellulose butyrate, mixed esters such as cellulose acetate propionate, cellulose acetate butyrate and the like. An example of the cellulose ethers is ethyl cellulose. Opaque materials such as paper and cloth may also be used.

We may also use as a base a film of a material having one surface which is hydrophilic, in which case the hydrophilic surface functions as the carrier layer for the photomechanical layer. For example, we may use a cellulose ester film having one surface thereof saponified, or we may use a film of regenerated cellulose which is hydrophilic or films of a solid solution of a cellulose ester and of a copolymer of a vinyl ether, i.e., vinyl methyl, vinyl ethyl, vinyl propyl, etc. and maleic anhydride, one surface of which has been hydrolyzed. The carrier layer may also beformed by coating a film of hydrophobic material with a layer of a hydrophilic material. Thus, we may use preformed films generally used in the photographic industry which carry a coating of gelatin which is hydrophilic, or a film of cellulose actate coated with a layer of a solid solution of cellulose acetate and copolymer of vinyl methyl ether/maleic anhydride, which layer has been hydrolyzed in situ. The dye component may be incorporated in the carrier layer by impregnating the layer with a solution of the component or by mixing the component with the solution used to form the carrier layer on the base.

The carrier layer need not initially be hydrophilic in nature provided it can be rendered so by treatment with mildly alkaline solutions of the type used as a developing solution. The carrier layer may, for example, comprise a vinyl alkyl ether maleic anhydride copolymer such as polyvinyl methyl ether/maleic anhydride, which for the sake of brevity is usually designated as PVM/MA in equimolar proportions coated on a suitable base, which carrier layer has not been hydrolyzed prior to coating it with the photomechanical layer but is hydrolyzed by the developing solution.

When PVM/MA is used in the carrier layer, satisfactory results are obtained when this resin is used alone. The best results are, however, obtained when the carrier layer comprises a solid solution of PVM/MA and another resin, usually one which is hydrophobic and compatible therewith. The hydrophobic resin imparts toughness and flexibility to the plate and eliminates the tendency of the carrier layer to crack and craze. The hydrophobic resin may be present in a quantity as great as 60% of the layer. Better results, however, are obtained when the hydrophobic resin does not exceed 40% by weight of the layer. The resins used must be compatible with each other in order to obtain a true solid solution rather than a heterogeneous mixture since a mixture would offer a variable surface to the processing solutions leading to non-uniformity in the creation of the hydrophilic character of the layer.

Examples of resins that are compatible with the copolymer of the vinyl alkyl ethers and maleic anhydride are the various cellulose esters such as cellulose acetate, cellulose propionate, cellulose butyrate, the mixed esters such as cellulose acetatepropionate, cellulose acetatebutyrate and the like, methyl acrylate, methyl methacrylate, polyvinyl resins such as polyvinyl acetate, polyvinyl acetals such as polyvinyl butyral and the like. Of the various grades of commercially available cellulose acetates, grades which contain combined acetic acid from as low as 52% to as high as 61.8% (triacetate) can be employed. If a cellulose ester is used as the hydrophobic resin in solution with PVM/MA, it is preferred that it be of high acyl content, for we have found that greater uniformity and consistency of response are obtained when cellulose esters of the highest degree of acylation are utilized. When a high acyl cellulose ester is used, a relatively higher proportion of the vinyl ether copolymer is required for optimum results than when a low acyl cellulose ester is used.

The solvents which we have found to be suitable for dissolving a composition comprising the vinyl ether copolymer and a resin compatible therewith for the purpose of forming the carrier layer are normally liquid relatively low boiling organic solvents such as methyl Cellosolve, acetone, methylene chloride, dioxane, tetrahydrofurane, cyclohexanone, methylethyl ketone and various mixtures of the same such as methylene chloride, methyl Cellosolve and acetone, methyl Cellosolve and dioxane, methyl Cellosolve and cyclohexanone, methyl Cellosolve and tetrahydrofurane and the like. These solvents, because of their relatively low boiling point, can be readily removed to yield a dry lacquer film on the base.

The dye component may be incorporated in the solution of vinyl ether copolymer and hydrophobic resin or the carrier layer may first be formed without the dye component and the layer thereafter impregnated with a separate solution containing the dye component.

The sensitizing component of the light-sensitive or photomechanical layer is a diazo oxide which is water insoluble but which is soluble to the extent of at least 1% in a solvent which is normally liquid and is an aliphatic ester, an aliphatic ketone or an aliphatic alcohol, i.e., alcohols in which the OH group is aliphatically linked. Examples of such solvents are ethylacetate, butylacetate, amylacetate and the like, acetone, diethyl ketone, methylpropyl ketone, methylisobutyl ketone, dipropyl ketone, methylethyl ketone, methylbutyl ketone and the like, ethyl alcohol, isopropyl alcohol, butyl alcohol, diacetone alcohol, benzyl alcohol and the like. Not all of these solvents are suitable for use in forming the solution used for the photomechanical layer since certain of the solvents mentioned above such as acetone, ethyl alcohol and isopropyl alcohol tend to dissolve and destroy the carrier or lacquer layer, but all of these solvents may be used to determine the suitability of a particular diazo oxide for use as the sensitizing component in the photomechanical layer. Certain diazo oxides of extremely high molecular weight and complex structure are of such a mixed polar-non-polar character that they are not soluble in solvents mentioned above but are only soluble in such powerful solvents as dimethylformamide, dimethylacetamide and the like, which solvents penetrate and dissolve the carrier layer and are therefore unsuitable for our purpose.

Diazo oxides which we have found to be particularly suitable are those derived by esterification or amidation of 2-diazo-1-naphthol-5-sulfonyl chlorides or 2-naphthol-1-diazo-5 sulfonyl chlorides with comparatively simple amines or alcohols or with more complex compounds which possess a saturated, unconjugated, non-polar molecule such as rosin amines, rosin alcohols and their derivatives.

The above diazo oxides may be represented by the following chemical formulae:

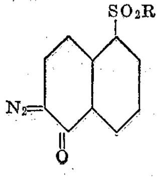

and

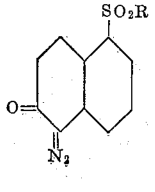

wherein R is alkoxy, i.e., methoxy, ethoxy, propoxy, aryloxy such as phenoxy, naphthoxy and the like; amino such as primary amino, alkyl amino, i.e., methylamino, dimethylamino, ethylamino, diethylamino, propylamino, dipropylamino, butylamino and the like, aralkylamino such as benzylamino, dehydroabietylamino, didehydroabietylamino, carbethoxymethylamino, carbethoxyethylamino and the like. Specific examples of diazo oxides which are embraced by the above formulea are:

2-diazo-1-naphthol-5-sulfuric acid ethyl ester
2-diazo-1-naphthol-5-sulfuric acid methyl ester
2-diazo-1-naphthol-5-sulfuric acid phenyl ester
2-diazo-1-naphthol-5-sulfuric acid naphthyl ester
2-diazo-1-naphthol-5-sulfuric acid butyl ester
2-diazo-1-naphthol-5-sulfuric acid benzyl ester
1-diazo-2-naphthol-5-sulfuric acid ethyl ester
1-diazo-2-naphthol-5-sulfuric acid phenyl ester
2-diazo-1-naphthol-5-sulfonamide
2-diazo-1-naphthol-5-N-methylsulfonamide
2-diazo-1-naphthol-5-N-(carbmethoxymethyl)-sulfonamide
2-diazo-1-naphthol-5-N-(carbethoxymethyl)sulfonamide
2-diazo-1-naphthol-5-N-dimethylsulfonamide
2-diazo-1-naphthol-5-N-butylsulfonamide
2-diazo-1-naphthol-5-N-dibutylsulfonamide
N-dehydroabietyl-6-diazo-5(6)-oxo-1-naphthalenesulfonamide
N-dehydroabietyl-N-2-hydroxyethyl-6-diazo-5(6)-oxo-1-naphthalenesulfonamide
N,N'-didehydroabietyl-N,N'-ethylene-bis[6-diazo-5(6)-oxo-1-naphthalenesulfonamide]

The aforementioned diazo oxides, excepting for those containing the rosin amine structure, are known compounds and are prepared by a simple esterification or amidation of the sulfonyl chloride in the presence of an acid binding agent such as pyridine. The rosin derivatives, on the other hand, are prepared according to the method described in U.S. Patent 2,797,213.

Of the solvents which we have previously mentioned for use in connection with the diazo oxides, we have found that the normally liquid aliphatic esters, the normally liquid aliphatic ketones boiling above 100° C. and the normally liquid aliphatic or araliphatic alcohols containing at least four carbon atoms are especially suitable since they dissolve the diazo oxide but do not dissolve the carrier or lacquer layer and do not materially penetrate said layer.

The diazo oxide of the type described above may be used alone as the photomechanical layer. However, we have found the better results are obtained when the diazo oxide is mixed with a resinous polymer. Vinyl resins such as polyvinyl acetate, acrylic polymers such as methyl acrylate and methyl methacrylate, cellulose esters such as cellulose acetate, cellulose propionate, mixed esters such as cellulose acetate propionate and cellulose acetate butyrate and cellulose ethers such as ethyl cellulose are suitable resinous materials for mixing with the diazo oxide to form the photomechanical layer. The resinous polymers mentioned above are all soluble in the same solvents as is the diazo oxide and may be dissolved in the same solvent or solvent mixture to form a solution for spreading on the carrier or lacquer layer to form the photomechanical layer.

The diazo oxide used by us in the photomechanical layer is not soluble nor permeable to mildly alkaline solutions used in the development step, especially when the diazo oxide is mixed with a resinous polymer. However, irradiation changes the chemical nature of the photomechanical layer so that it becomes soluble in or permeable to alkaline solutions. Actinic light acting on compounds containing the grouping

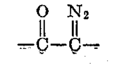

causes the loss of nitrogen accompanied by a rearrangement to form a ketene intermediate (Horner and Spietchka Ber., 85, 225–29 (1952)) which in the presence of water undergoes the following reaction

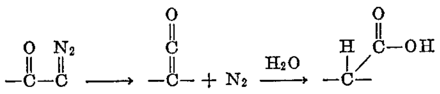

to form an alkali soluble carboxylic acid.

The mildly alkaline developing soultion is formed by dissolving a base, either organic or inorganic, in a suitable solvent such as water, ethylene glycol and the like. To this solution is added a color-forming component which is capable of reacting with or cause reaction of the color-forming component or components incorporated in the carrier layer. Glycol, alcohol, glycerin and other additives may be included in the developing solution to effect changes in the viscosity and/or development speed of the solution. The amines and alkanolamines are examples of the organic bases which may be used to form the developing solution and sodium hydroxide, potassium carbonate, trisodium phosphate and the like are examples of the inorganic bases which may be used for this purpose.

In some cases it was found to be advantageous to add inorganic salts such as sodium chloride, potassium chloride, sodium sulfate and the like to the developing solution. We have found that these salts tend to maintain the resist areas of the photomechanical layer intact. This is especially true when the photomechanical layer is composed of water insoluble diazo oxide and a substantially water soluble or water swellable resinous polymer such as polyvinylpyrrolidone or the like. In such cases, the salted developer tends to hold the photomechanical layer intact so that imagewise diffusion and color formation occur. The photomechanical layer may then be removed in clear, unsalted tap water as a method of fixation.

Almost any color-forming reaction may be used in our process to produce the image in the carrier layer. In Table I below are listed a few of the compounds which when brought together will react to produce a visible color. As indicated in the table, certain of these compounds are incorporated in the carrier or lacquer layer while the complementary compounds are incorporated in the developing solution.

to remove the photomechanical layer, this can be accomplished with a selected solvent or solvent system which is a solvent for the photomechanical layer but does not materially dissolve or bleed the dye or color formed in the image areas and the remainder of the structure, consisting of the base and carrier layer which carries the image, can then be used as the intermediate master. The solvent or solvent system that can be used for removing the photomechanical layer depends largely upon the nature of the dye or color formed in the image areas. In general, we have found that carbon tetracholoride, toluene, isopropyl alcohol and mixtures thereof may be used as solvents for removing the photomechanical layer.

Specific examples of our improved process are given below. It is to be understood, however, that these examples are given by way of illustration and not by way of limitation.

*Example I*

A preformed film of cellulose acetate was coated by the reverse roll method with the following solution:

| | | |
|---|---|---|
| PVM/MA (polyvinyl methyl ester/maleic anhydride copolymer) | parts by weight | 4.5 |
| Cellulose acetate | do | 5.5 |
| Acetone | parts by volume | 140 |
| Ethanol | do | 40 |
| Methyl Cellosolve | do | 20 |

After drying, hydrolysis was effected by immersion in a dilute solution of ammonia and the film again dried.

A film prepared in this manner is hydrophilic and can be coated with a number of sensitizing solutions from aqueous media. The preparation of this sort of hydrophilic film is more fully described in U.S. Patent 2,854,338. Such a hydrophilic base material will hereinafter be referred to as 0–7 Base.

This hydrophilic surface was next coated with a solution of the following composition:

| | | |
|---|---|---|
| Silver nitrate | parts by weight | 30 |
| Ethanol | parts by volume | 25 |
| Water | do | 75 |

and the excess solution removed with a doctor blade. After drying, this film was then coated by a bead coater with a solution consisting of:

TABLE I

| Color Component Incorporated in Carrier Layer | Color Component Incorporated in Developer | Reaction Involved |
|---|---|---|
| $AgNO_3(Ag^+)$ | Hydroquinone$+OH^-$ | $Ag^+ + E^- \rightarrow Ag$ |
| $Pb(CH_3COO)_2(Pb^{++})$ | $Na_2S(S^-)+OH^-$ | $Pb^{++} + S \rightarrow PbS$ |
| Indicator dye (colorless) | $OH^-$ | Colorless form $\xrightarrow{OH^-}$ Colored form |
| Starch$+I^-$ | Oxidizing agent$+OH^-$ | $2I^- - 2E^- \rightarrow I_2$; $I_2$+Starch→Blue-black color |
| Diazonium Salt | Coupler$+OH^-$ | Diazo+Coupler→Dye |
| Color Photography Developer | Oxidizing agent$+OH^-$ | Dye |
| Color Photography Coupler | Ex. 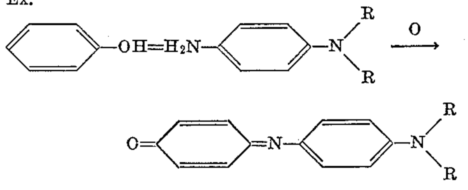 | |

The simplest and most convenient way in which to stop the action of the developer and thereby fix the copy is by merely rinsing the copy under a stream of tap water.

As already stated, the copy resulting from the development of our novel photosensitive structure can be used as such as an intermediate master. However, if it is desired

| | | |
|---|---|---|
| Polyvinyl acetate | grams | 2.5 |
| N-dehydroabietyl-6-diazo-5(6)-oxo-1-naphthalenesulfonamide | do | 4 |
| Methyl isobutyl ketone | milliliters | 100 |

The above diazo and its method of preparation are described in U.S. Patent 2,797,213.

A sheet of this dried material was placed over a sheet of white opaque paper with black printing and exposed at 15 feet per minute in an Ozamatic whiteprint machine. The exposed sheet was then placed in a tray containing a solution of the following composition:

| | | |
|---|---|---|
| Monoethanolamine | parts by volume | 1.5 |
| Triethanolamine | do | 10.0 |
| Glycerin | do | 25.0 |
| Ethylene glycol | do | 63.5 |
| Hydroquinone | parts by weight | 5.0 |

whereupon a black negative reflex image of the original document appeared. Development was halted by a thorough rinsing under a stream of tap water. Residual photomechanical layer could be removed, if desired, by an application of ethanol, methylisobutyl ketone, or hexylene glycol. The black reflex copy obtained in this manner served well as an intermediate for making subsequent diazotype copies.

*Example II*

A base material consisting of cellophane and laminated to the calendered surface of a heavy weight clay coated paper was coated by the bead method with a solution consisting of 35 grams of lead acetate and 100 milliliters of water. After drying, it was overcoated with a solution of the following composition:

| | | |
|---|---|---|
| N-dehydroabietyl-6-diazo-5(6)-oxo-1-naphthalenesulfonamide | grams | 2.5 |
| Polyvinyl acetate | do | 2.5 |
| Methylethyl ketone | milliliters | 100 |

This coating was dried. A piece of this material was then exposed under a mercury arc beneath a negative. This exposed material was developed with a solution consisting of:

| | | |
|---|---|---|
| Diethanolamine | milliliters | 10 |
| Ethylene glycol | do | 60 |
| Water | do | 30 |
| Sodium sulfide | grams | 2 |

whereupon a brownish-black positive copy of the original negative was formed. The surface of the print was swabbed with water and then isopropyl alcohol to remove excess developing solution and residual photomechanical layer respectively.

*Example III*

Some 0-7 base as prepared in Example I was bead-coated with a solution of the following composition:

| | | |
|---|---|---|
| Zinc chloride double salt of diazotized para-anisidine | parts by weight | 3.5 |
| Sulfosalicylic acid | do | 1.0 |
| Hydrochloric acid | parts by volume | 2.0 |
| Water | do | 100 |
| Lauryl sulfate | do | 0.5 |

This coating was dried and then overcoated with a solution of the following composition:

| | | |
|---|---|---|
| N-dehydroabietyl-6-diazo-5(6)-oxo-naphthalenesulfonamide | parts by weight | 4 |
| Polyvinylacetate | do | 3 |
| Methylisobutyl ketone | parts by volume | 100 |

This coating was dried. Exposure beneath a negative original followed by development in a solution of the following composition:

| | | |
|---|---|---|
| Monoethanolamine | parts by volume | 1.0 |
| Triethanolamine | do | 6.7 |
| Glycerin | do | 16.7 |
| Ethylene glycol | do | 42.3 |
| Water | do | 33.3 |
| 2,4-diaminotoluene | parts by weight | 6.0 |

yielded an excellent positive copy whose image areas were a dark reddish-brown azo dye having excellent reprint opacity. If desired, the residual photomechanical layer could be removed with a mixture of 3 parts carbon tetrachloride and one part methylisobutyl ketone.

*Example IV*

The hydrophilic base material was coated as in Example III but the diazotized para-anisidine double salt was substituted by an equal amount of one of the following diazotized amines used as an appropriate double salt with zinc chloride:

Ortho-anisidine
2,6-Dimethoxyaniline
2,6-Dimethoxyaniline
Ortho-phenetidine
Para-phenetidine
3,3′-Dimethoxy-4,4′-diaminobiphenyl
2-Chloro-5-trifluoromethylaniline
2-Hydroxy-4-methyl-7-aminoquinoline
4-Aminobiphenyl
Para-acetaminoaniline
N,N-diethylamino-para-phenylenediamine
N,N-dimethylamino-para-phenylenediamine
4-(N,N-diethylamino)-2-ethoxyaniline
4-(N,N-diethylamino)-2-methylaniline
4-Ethylamino-3-methylaniline After these diazotized amines were applied, the photomechanical layer was applied as in Example III. After exposure any of these materials may be developed in a solution of the following composition:

| | | |
|---|---|---|
| 2,4-diaminotoluene | parts by weight | 4 |
| Trisodium phosphate | do | 3 |
| Ethylene glycol | parts by volume | 30 |
| Water | do | 70 |

Double salts of the above amines with other inorganic salts such as stannic chloride, boron fluoride, etc., may be substituted for the double salt of the amine and zinc chloride in the above example.

Any of the exposed materials, prepared as above, may be developed in a solution of the following composition:

| | | |
|---|---|---|
| Monoethanolamine | parts by volume | 4 |
| Ethylene glycol | do | 60 |
| Water | do | 40 |
| 2,4-diaminotoluene | parts by weight | 4 |

An alternate developing solution can be made the same as that above except that an equal amount of m-aminophenol is subsituted for the 2,4-diaminotoluene.

*Example V*

Some gelatin coated triacetate filmbase was coated with a solution of the following composition:

| | | |
|---|---|---|
| Diazotized ortho-anisidine | parts by weight | 5 |
| Citric acid | do | 0.5 |
| Water | parts by volume | 100 |

This coating was dried and then overcoated with a solution consisting of:

| | | |
|---|---|---|
| N-dehydroabietyl - 6 - diazo-5(6)-oxonaphthalenesulfonamide | parts by weight | 5 |
| Polyvinyl acetate | do | 3.5 |
| Methylethyl ketone | parts by volume | 100 |

This coating was dried. A piece of this material was then exposed reflexwise to an opaque original and developed in a solution of:

| | | |
|---|---|---|
| Trisodium phosphate | parts by weight | 4 |
| Meta-aminophenol | do | 4 |
| Ethylene glycol | parts by volume | 10 |
| Water | do | 90 |

An excellent yellowish-orange reflex image was formed which acted as an intermediate for making subsequent diazotype copies.

An equal amount of cellulose acetate (about 55% combined acetic acid) may be substituted for the polyvinyl acetate as used in this example.

*Example V*

Some 0–7 Base as prepared in Example I was coated with a solution of the following composition:

| | | |
|---|---|---|
| Diazotized p-anisidine | parts by weight | 5 |
| 2,2′,4,4′-tetrahydroxybiphenyl | do | 5 |
| Sulfosalicyclic acid | do | 1 |
| Water | parts by volume | 80 |
| Dioxane | do | 15 |
| Hydrochloric acid | do | 5 |

The excess solution was removed with a doctor blade and the material dried. This surface was then bead-coated with a solution consisting of:

| | | |
|---|---|---|
| N-dehydroabietyl - 6 - diazo-5(6)-oxonaphthalene-sulfonamide | parts by weight | 7.5 |
| Polyvinylacetate | do | 5.6 |
| Methylisobutyl ketone | parts by volume | 100 |

This coating was dried. A piece of this material was exposed reflexwise over an opaque original and subsequently developed in a solution comprising:

| | | |
|---|---|---|
| Trisodium phosphate | parts by weight | 4 |
| Ethylene glycol | parts by volume | 10 |
| Water | do | 90 |

whereupon a dark orange reflex image was obtained. Excellent diazotype copies were made from this reflex intermediate.

*Example VII*

A preformed film of cellulose acetate was bead-coated with a solution of the following composition:

| | | |
|---|---|---|
| Methyl Cellosolve | parts by volume | 100 |
| PVM/MA | parts by weight | 1.5 |
| Cellulose acetate | do | 1.5 |
| Thiourea | do | 0.2 |
| Citric acid | do | 0.4 |
| Sulfosalicyclic acid | do | 0.4 |
| Fluoborate salt of diazotized 4-ethylamino-3-methyl-aniline | parts by weight | 3.0 |
| Zinc chloride | do | 0.1 |

This coating was dried. This surface was then bead-coated with the same photomechanical sensitizing solution employed in Example VI. This coating was dried. A piece of this material was then exposed and developed as in Example IV, washed beneath a stream of tap water, and residual photomechanical layer removed by swabbing with isopropyl alcohol. There resulted a brownish-black, negative reflex copy which was excellent in general quality and resolution and suitable as an intermediate for subsequent diazotype reprints.

*Example VIII*

Some of the cellophane laminated paper employed in Example II was bead-coated with a solution of the following composition:

| | | |
|---|---|---|
| Zinc chloride double salt of diazotized p-anisidine | parts by weight | 3 |
| Sulfosalicylic acid | do | 1 |
| Thiourea | do | 0.5 |
| Water | parts by volume | 100 |

After drying, this surface was bead-coated with a solution of the following composition:

2 parts by weight of the compound having the following structural formula:

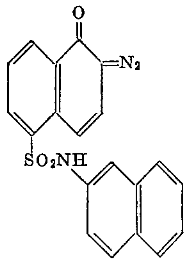

| | | |
|---|---|---|
| Polyvinyl acetate | parts by weight | 2 |
| Methylethyl ketone | parts by volume | 100 |

This coating was dried. After an exposure beneath a negative original, this material was developed in the same solution employed in Example IV, washed under a stream of tap water, and residual photomechanical layer removed with hexylene glycol. A dark red image resulted which was a positive copy of the original negative.

*Example IX*

Some gelatin-coated filmbase as described in Example V was bead-coated with a solution of the following composition:

3 parts by weight of the stannic chloride double salt of the following diazotized amine:

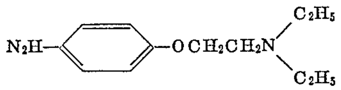

| | | |
|---|---|---|
| Thiourea | parts by weight | 0.5 |
| Citric acid | do | 1 |
| Water | parts by volume | 100 |

After drying, this surface was bead-coated with a solution of the following composition:

2 parts by weight of the compound represented by the following structural formula:

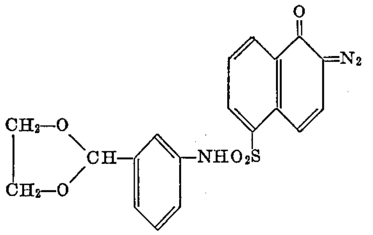

| | | |
|---|---|---|
| Polyvinyl acetate | part by weight | 1 |
| Isopropyl alcohol | parts by volume | 50 |
| Methylethyl ketone | do | 50 |

This coating was dried. This material could be exposed reflex-wise or by transmission and developed in a solution like that used in Examples III or IV, to yield yellow to orange negative copies of the original, suitable as intermediates for subsequent copying onto diazotype material.

EXAMPLE X

Some 0–7 Base as prepared in Example I was bead-coated with a solution comprising:

4 parts by weight of the stannic chloride double salt of the amine represented by the following structural formula:

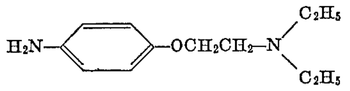

| | | |
|---|---|---|
| Sulfosalicylic acid | part by weight | 1 |
| Citric acid | do | 1 |
| Water | parts by volume | 100 |

After drying, this surface was coated with a solution comprising:

2 parts by weight of the compound represented by the following structural formula:

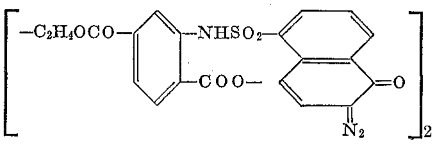

100 parts by volume of methyl isobutyl ketone.

This coating was dried. This material was exposed reflexwise and by transmission and developed in a solution such as those employed in Examples III or IV to yield yellow to orange negative copies of the original, suitable as intermediates for subsequent diazotype copying.

*Example XI*

Some 0–7 Base as prepared in Example I was bead-coated with a solution of the following composition:

| | | |
|---|---|---|
| Para-phenylenediamine | parts by weight | 5 |
| Acetoacetanilide | do | 5 |
| Thiourea | do | 1 |
| Water | do | 100 |

After drying, this surface was overcoated with a solution of the following composition:

| | | |
|---|---|---|
| N-dehydroabietyl-6-diazo-5(6) - oxonaphthalesulfonamide (hereinafter called R–2) | parts by weight | 5 |
| Polyvinyl acetate | do | 5 |
| Methylisobutyl ketone | parts by volume | 100 |

This coating was dried. A piece of this material was exposed beneath a negative original and then developed in a solution of the following composition:

| | | |
|---|---|---|
| Trisodium phosphate | parts by weight | 5 |
| 5.25% solution of sodium hypochlorite | parts by volume | 10 |
| Water | do | 90 |

whereupon a yellowish-brown negative image was formed. After rinsing under a stream of tap water, the residual photomechanical layer was removed with hexylene glycol or methylisobutyl ketone to yield an excellent intermediate for subsequent diazotype copies. Other oxidizing agents which could be used in the place of the sodium hypochlorite include sodium dichromate, potassium ferricyanide and potassium periodate.

*Example XII*

A film of cellulose acetate was coated with the following solution to provide the carrier or dye-forming layer:

| | | |
|---|---|---|
| Acetone | cc | 60 |
| Ethyl acetate | cc | 35 |
| Methyl Cellosolve acetate | cc | 5 |
| PVM/MA | grams | 3.6 |
| Cellulose triacetate | do | 2.4 |
| 5-Sulfosalicylic acid | do | 1 |
| Zinc chloride | do | .4 |
| 3-Hydroxy-2′-methoxy-2-naphthanilide | do | .35 |
| 3-Hydroxy-2′-methyl-2-naphthanilide | do | .65 |
| 2,2′,4,4′-Tetrahydroxybiphenyl | do | .92 |
| p-Diethylaminobenzene diazonium fluoborate | do | 1.5 |

After drying, the carrier layer was overcoated with the following solution:

| | | |
|---|---|---|
| Polyvinyl acetate | grams | 4 |
| R–2 | do | 2.5 |
| Methylisobutyl ketone | cc | 100 |

This layer was dried and the resulting product was exposed to a negative pattern in a whiteprint machine and developed with the following developer:

| | | |
|---|---|---|
| Monoethanolamine | cc | 9 |
| Triethanolamine | cc | 60 |
| Glycine | cc | 150 |
| Ethylene glycol | cc | 380 |

A negative reflex image was formed.

*Example XIII*

A cellulose acetate base was coated with the following solution to form the dye-forming carrier layer:

| | | |
|---|---|---|
| Acetone | cc | 30 |
| Ethyl acetate | cc | 17.5 |
| Methyl Cellosolve acetate | cc | 2.5 |
| PVM/MA | grams | 3.6 |
| Cellulose acetate | do | 2.4 |
| 5-Sulfosalicylic acid | do | 1 |
| Zinc chloride | do | .6 |
| 4,4′-Diresorcyl sulfide | do | 1 |
| p-(2-Diethylamino)ethoxybenzene diazonium stannichloride | do | 1 |
| Water | cc | 5 |
| Ethyl Cellosolve | cc | 5 |
| Acetone | cc | 30 |
| Ethyl acetate | cc | 10 |

The coating was dried and then overcoated with the following solution:

| | | |
|---|---|---|
| Polyvinyl acetate | grams | 3 |
| R–2 | do | 4 |
| Methylisobutyl ketone | cc | 100 |

This layer was dried, exposed to a whiteprint machine and developed in the developer of Example XII. A negative image was obtained.

*Example XIV*

A filmbase was coated with the following solution:

| | | |
|---|---|---|
| Acetone | cc | 55 |
| Methyl Cellosolve | cc | 45 |
| p-(2-Diethylamino)ethoxybenzene diazonium stannichloride | grams | 1 |
| Zinc chloride | do | .6 |
| 5-Sulfosalicylic acid | do | 1 |
| 4,4′-Diresorcyl sulfide | do | 1 |
| Cellulose acetate | do | 1.6 |
| Copolymer of methylacrylate and methylmethacrylate | do | .8 |

After drying, this coating was coated with the following solution:

| | | |
|---|---|---|
| Polyvinyl acetate | grams | 1.5 |
| Copolymer of methacrylate and methylmethacrylate | do | .5 |
| Polyvinylidene chloride | do | 1.5 |
| R–2 | do | 3 |
| Methylisobutyl ketone | do | 100 |

After drying this coating, the sensitized product was exposed in a whiteprint machine and developed in the developing solution of Example XII. A negative image was obtained.

The accompanying drawing illustrates our novel process. In the drawing.

Figure 1:
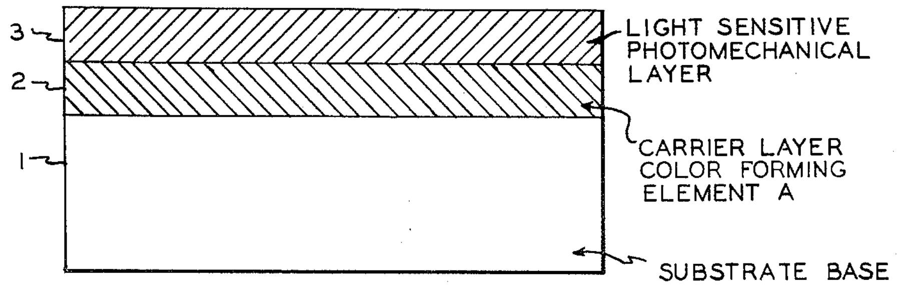
FIG. 1 is a view in cross-section of our novel light-sensitive structure.

FIG. 1 of the drawing shows the various layers forming our novel light-sensitive structure after it is completed but prior to exposure. Reference character 1 denotes the base, 2 is the carrier layer containing one or more color-forming components and 3 is the photomechanical layer containing a diazo oxide as the sensitizing material.

Figure 2:
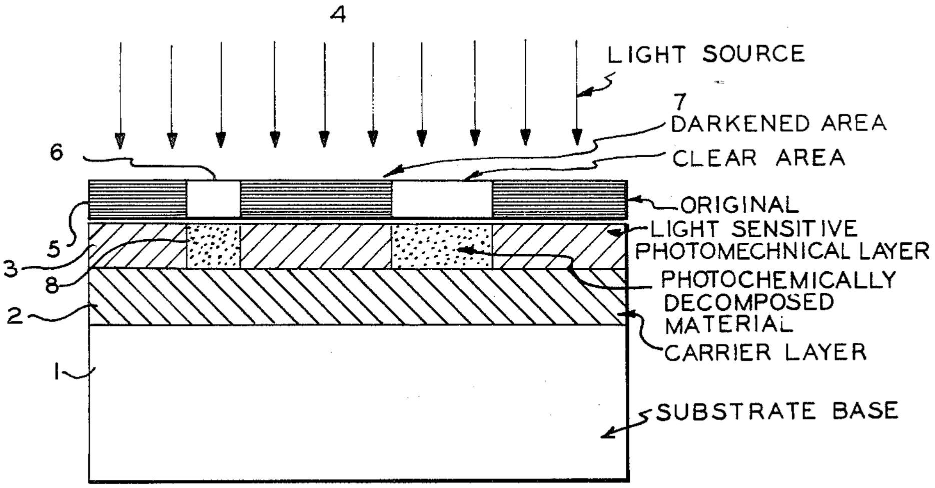
FIG. 2 is a view similar to FIG. 1 illustrating the manner in which our novel structure may be exposed.
Figure 3:
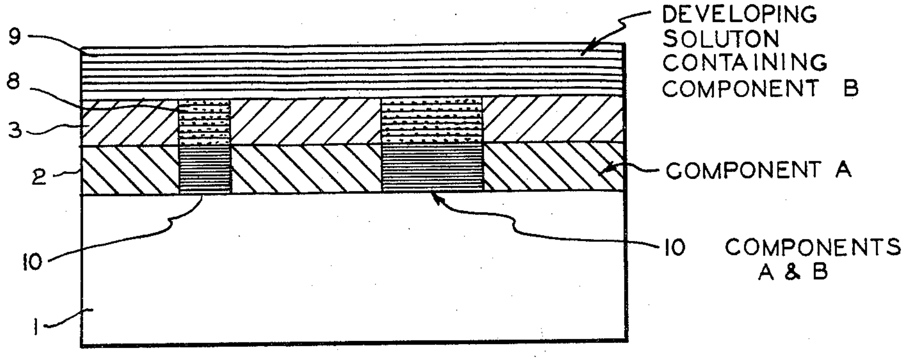
FIG. 3 is a view similar to FIG. 1 but showing our novel structure while in contact with the developing solution.
Figure 4:
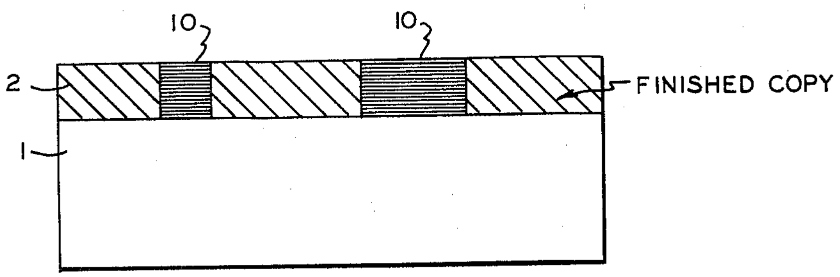
FIG. 4 is a view similar to FIG. 1 showing the completed intermediate master with the photomechanical layer removed.

FIG. 2 shows our novel structure in position while being exposed. The arrows 4 denote the actinic light being directed on the original 5 which is being copied. This original has light areas 6 through which the actinic light passes and strikes the areas 8 of the photomechanical layer directly therebeneath, thereby causing a chemical reaction to take place in these areas which renders them permeable to the alkaline developing solution. 7 denotes the darkened areas of the original. The actinic light cannot penetrate the darkened areas 7 and these areas, therefore, shield the areas of the photomechanical layer directly therebeneath from the light and no chemical reaction takes place in these areas. The shielded areas of the photomechanical layer remain impermeable to the developing solution.

The exposed structure after removal of the original is developed with an alkaline developing solution 9 containing a color-forming component capable of reacting with the color-forming component in layer 2. The developing solution 9 penetrates the areas 8 and contacts the layer 2 in areas 10 directly beneath areas 8, whereby the color components in the developing solution 9 and layer 2 react to form colored areas 10. The developing solution does not penetrate the unreacted areas of the photochemical layer in the time allotted for development and the areas of the carrier layer 2 directly therebeneath do not come in contact with the developing solution so that no color formation takes place in the last mentioned areas. An over-all image is thereby formed in the carrier layer. The developed structure is then rinsed under a stream of tap water to remove the developing solution. If desired, the entire photomechanical layer may be removed by means of a suitable solvent as already indicated.

By the process outlined above, a finished negative copy of the positive original having colored and non-colored areas is produced. The copies thus produced have high contrast and excellent resolution due to the unique combination of reagents and type of light-sensitive layer which we employ. Thus, if in the time allotted for development the developing solution fails to diffuse or penetrate through a given light-struck area to the carrier layer, no dye or color formation takes place in that area, whereas another area which has received only a slightly longer exposure becomes somewhat more permeable and the slightly increased permeability in the last mentioned area allows penetration of the developing solution to the carrier layer, whereby dye or color formation takes place.

Many modifications of our invention will occur to a person skilled in the art. Our invention is, therefore, not limited to the detailed description given above but includes all modifications that fall within the scope of the appended claims.

We claim:

1. A light-sensitive structure comprising a base having a surface layer which is hydrophilic toward mildly alkaline aqueous solutions and which has incorporated therein a member of a pair of color forming components which yield upon inter reaction a colored reaction product, and a light-sensitive coating which is relatively impermeable toward mildly alkaline aqueous solutions overlying said hydrophilic layer and containing a light-sensitive water-insoluble diazo oxide which is soluble in a solvent selected from the group consisting of liquid aliphatic esters, aliphatic ketones and aliphatic alcohols and the light decomposition products of which are permeable toward said mildly alkaline aqueous solutions.

2. A light-sensitive structure as recited in claim 1 wherein the color-forming component incorporated into said surface layer is silver nitrate.

3. A light-sensitive structure as recited in claim 1 wherein the color component incorporated into said surface layer is a diazonium salt.

4. A light-sensitive structure as recited in claim 1 wherein the color-forming component incorporated into said surface layer is lead acetate.

5. A light-sensitive structure as recited in claim 1 wherein the base is a cellulose acetate film and the hydrophilic surface is formed by a coating comprising polyvinyl methyl ether/maleic anhydride copolymer which has been hydrolyzed in situ.

6. A light-sensitive structure as recited in claim 1 wherein the hydrophilic surface comprises a film of regenerated cellulose.

7. A light-sensitive structure as recited in claim 1 wherein the light-sensitive coating comprises a mixture of polyvinyl acetate and N-dehydroabietyl-6-diazo-5(6)-oxo-naphthalene-sulfonamide.

8. A process of forming an intermediate master by diffusion printing which comprises exposing to a source of actinic light an original having an image thereon to be copied together with a light-sensitive sheet comprising a base having a surface layer which is hydrophilic toward mildly alkaline aqueous solutions and which has incorporated therein a member of a pair of color forming components which yield upon inter reaction a colored reaction product, and a light-sensitive coating which is relatively impermeable toward mildly alkaline aqueous solutions over-lying said hydrophilic layer and containing a light-sensitive water-insoluble diazo oxide which is soluble in a solvent selected from the group consisting of liquid aliphatic esters, aliphatic ketones and aliphatic alcohols and the light decomposition products of which are permeable toward said mildly alkaline aqueous solutions, removing the original and developing the exposed light-sensitive sheet with an alkaline solution having incorporated therein the other of said pair of color forming components, whereby through inter-action of said components a color is produced only in the light-exposed areas of the sheet and rinsing the sheet with water to remove the alkaline solution.

9. A process of forming an intermediate master as recited in claim 8 wherein the sheet, after rinsing, is treated with a solvent for the light-sensitive layer in which said colored reaction product developed in the hydrophilic surface is insoluble, to remove the light-sensitive coating from the sheet, said solvent being selected from the class consisting of carbon tetrachloride, toluene, isopropyl alcohol, and mixtures thereof.

10. A process of forming an intermediate master as recited in claim 8 wherein the color-forming component incorporated in the hydrophilic surface is silver nitrate and the component incorporated in the alkaline solution is hydroquinone.

11. A process of forming an intermediate master as recited in claim 8 wherein the color-forming component incorporated in the hydrophilic surface is lead acetate and the component incorporated in the alkaline solution is sodium sulfide.

12. A process of forming an intermediate master as recited in claim 8 wherein the component incorporated in the hydrophilic surface is a diazonium salt and the component incorporated in the alkaline solution is a coupling compound capable of coupling with said diazonium salt to produce a dye.

13. A process of forming an intermediate master as recited in claim 8 wherein the hydrophilic surface is formed by a layer comprising a hydrolyzed solid solution comprising cellulose acetate and polyvinyl methyl ether/maleic anhydride copolymer.

14. A process of forming an intermediate master as recited in claim 8 wherein the light-sensitive coating comprises a mixture of polyvinyl acetate and N-dihydroabietyl-6-diazo-5(6)-oxo-naphthalenesulfonamide.

15. A process of forming an intermediate master as recited in claim 8 wherein the alkaline solution comprises an alkanolamine dissolved in ethylene glycol.

References Cited by the Examiner

UNITED STATES PATENTS

| | | | |
|---|---|---|---|
| 428,472 | 5/1890 | Dubois | 96—33 |
| 2,702,243 | 2/1955 | Schmidt | 96—33 |
| 2,772,972 | 12/1956 | Herrick et al. | 96—33 |
| 2,792,303 | 5/1957 | Sanders et al. | 96—49 |
| 2,900,255 | 8/1959 | Charlton | 96—68 X |
| 2,994,608 | 8/1961 | Schmidt et al. | 96—91 |
| 2,996,381 | 8/1961 | Oster et al. | 96—49 |

NORMAN G. TORCHIN, *Primary Examiner.*

PHILIP E. MANGAN, *Examiner.*